United States Patent [19]

Deppe et al.

[11] Patent Number: 4,991,179
[45] Date of Patent: Feb. 5, 1991

[54] ELECTRICALLY PUMPED VERTICAL CAVITY LASER

[75] Inventors: Dennis G. Deppe, Bedminster; Russell J. Fischer, Berkeley Heights, both of N.J.; Kai-Feng Huang, Shenchu, Taiwan; Kuochou Tai, North Plainfield, N.J.

[73] Assignee: AT&T Bell Laboratories, Murray Hill, N.J.

[21] Appl. No.: 343,760

[22] Filed: Apr. 26, 1989

[51] Int. Cl.⁵ .............................................. H01S 3/19
[52] U.S. Cl. .................................... 372/45; 372/49; 372/92; 372/108
[58] Field of Search ...................... 372/45, 46, 50, 92, 372/96, 99, 49, 108

[56] References Cited

U.S. PATENT DOCUMENTS

| | | | |
|---|---|---|---|
| 4,581,744 | 4/1986 | Takamiya et al. | 372/92 |
| 4,819,243 | 4/1989 | Opschoor | 372/45 |
| 4,873,696 | 10/1989 | Coldren et al. | 372/96 |

Primary Examiner—James W. Davie
Attorney, Agent, or Firm—G. S. Indig

[57] ABSTRACT

An electrically pumped vertical cavity laser depends upon reflection as between an unaided DBR reflector on one side of the cavity and a metal-supplemented DBR reflector on the other. Placement of the shorter supplemented DBR on the p-conductivity type side of the cavity reduces the resistance of the electrical series pump path. Permitted use of an active region of a thickness of 1 μm or less in the lasing direction results in low lasing threshold. The structural approach is of significance for laser integration in integrated circuits, whether electro-optic or all-optic.

28 Claims, 4 Drawing Sheets

ELECTRICALLY PUMPED VERTICAL CAVITY LASER

BACKGROUND OF THE INVENTION

1. Field of the Invention

The invention is concerned with electrically pumped vertical cavity laser structures designed with a view to low lasing threshold current. While discrete devices are contemplated, an important aspect is in terms of integratable structures now made practical because of low threshold (and consequently, lowered heating).

2. Description of the Prior Art

A number of recent developments have directed attention to the need for inexpensive reliable lasers—both discrete and integrated. As important as the laser is in so many specialties—optical communications, medical diagnosis, weaponry, basic scientific inquiry, to name a few—development has lagged in very meaningful terms. The void resulting from unavailability of high density, small dimension, integrated devices is particularly noteworthy.

Advantages that would flow from introduction of a truly integratable laser e.g. permitting element-to-element communication on a chip, chip-to-chip communication, and performance of switching, amplification, and other functions now dependent on semiconductor elements are important and varied. It is estimated that computation speed could be doubled by use of all-optic circuitry. Projection displays and laser printers utilizing high density laser arrays would profoundly affect the industry.

Optical interconnect is generally contemplated in terms of inclusion in integrated circuits constructed of material suitable for performing electronic as well as optical functions. Use of e.g. III-Vs and other compound semiconductors of appropriate bandgap values will likely serve in Opto Electronic Integrated Circuits. Optical functions may play an important role in conjunction with silicon technology as well. Silicon circuitry likely to continue its electronic dominance for some time may be provided with optical capability by superimposition of chips of other material; for example, to provide for chip-to-chip communication.

Rapid introduction of fiber optics has already revolutionized long distance communications. Availability of inexpensive lasers will extend fiber optics both to the loop plant and to terminal connection (both in industry and the home).

Other implications include steerable beams for pointing, and high power arrays.

Such potential uses have not been overlooked. Intense worldwide effort has resulted in very significant advances. Recent work has produced devices of small size benefiting from sophisticated fabrication techniques such as Molecular Beam Epitaxy and Metal Organic Chemical Vapor Deposition. MBE, in particular, must be credited for emergence of layered structures requiring dimensional control, dimensional homogeneity, freedom from defects and surface smoothness, all in terms of a fraction of a wavelength (of contemplated radiation). Surface emitting vertical lasers may utilize such layered structures in the active region (e.g. in the form of quantum wells), as well as for defining the cavity (in the form of Distributed Bragg Reflectors.

A major obstacle to more general implementation of the laser is temperature increase due to heat generation attending lasing. This is particularly true for integration in which the problem is only aggravated for the higher packing densities which is a major thrust for integration. For any given level of efficiency of operation, need for heat dissipation decreases as lasing threshold decreases. Lasing threshold is in turn dependent—generally linearly dependent—on the volume of active material. Major effort has been in the direction of decreasing this volume.

The cavity structure is an important determinant for the thickness of active material between the mirrors. The ultimate requirement for any lasing structure is for a reflectivity/loss characteristic which accommodates per-pass gain for the stimulated radiation. Recently announced work appears to have carried this to the ultimate limit in permitting lasing with but a single quantum well in a surface emitting structure. ("Applied Physics Letters", vol. 55, no. 24, pp. 2473–2475 (1989). The work depends upon use of DBR mirrors of near-perfect reflectivity (reflectivity of 99.9% for a laser wavelength of 980 nm resulted from use of DBR mirrors each of approximately 20 periods). While the first experiments were based on optically pumping, the authors immediately realized implications in terms of electrically pumping.

Electrical pumping, the form most commercially significant devices will take, introduces problems. The DBR, clearly the best approach so far, does not intrinsically have the desirable electrical characteristics for serving in the series electrical pump path. Optimized Bragg structures of appropriate transparency, refractive index (n) and layer-to-layer index difference ($\Delta$n) introduces a level of $I^2R$ loss and heating to result in need for increased volume of active material (and still further heating). Beyond some level, heating is too great to be compensated by further volume increase. Modification of the DBRs to create the needed pn junction requires doping which implicitly results in scattering centers, and, therefore, in further loss (requiring further increase in volume of active material). The critical consideration in many design terms is the thickness dimension in the emission direction since, aside from diffraction effects, both loss and gain are generally linearly dependent on lateral dimensions—usually on lateral area.

One line of endeavor represented, for example, by an article in "Electronics Letters," vol. 24, no. 15, pp. 928, 929 (Jul. 21, 1988) seeks to avoid the problem by providing distinct electrical and optical paths. In the cited article, a Surface Emitting Laser having an active region of 3 $\mu$m thickness and 30 $\mu$m diameter was operated room temperature, pulsed at a threshold current, $I_{th}=200$ mA, equivalent to a current density of 30 kA/cm$^2$. The cavity in this instance used but a single DBR and depended on a conventional single-surface reflector on the other side. The authors' determination to put the DBR on the n-type side was no doubt dictated by the greater electrical resistance introduced by p-type doping. Other approaches also dependent upon use of distinct current and optical paths have used various means for injecting pumping currents laterally, e.g. at active material—mirror interfaces. "Applied Physics Letters", vol. 51, no. 21, pp. 1655-57 (Nov. 23, 1987).

It may be concluded that absence of truly low threshold current devices, for example, as required for ICs, is due, in one instance, to implicitly high resistance (for devices using coincident current and optical paths) and in the other, to fabrication difficulty as well as device function problems (for devices using distinct current and optical paths).

SUMMARY OF THE INVENTION

All aspects of the invention depend upon a particular laser structure. The structure is generally classified as a vertical cavity laser and is sometimes referred to as "surface emitting" to differentiate it from the edge emitting type of device. Lasers of the invention are capable of low lasing threshold which derives from use of relatively thin active regions (regions of a thickness of 1 μm or less), in turn permitted by excellent reflectivity-loss characteristics dependent upon use of DBR mirrors on both sides of the laser cavity. Electrical pumping in accordance with the inventive teaching depends upon current passage through both DBR mirrors in the same general vertical direction as that of the stimulated laser beam (in the terminology used current passage is referred to as "vertical" in the same sense used in defining lasing direction in the "vertical" cavity laser.

While all laser structures of the invention utilize two DBRs, one of the two has a lesser number of periods (a lesser number of paired layers) than the other so that this DBR is, in and of itself, inadequate to attain the desired cavity reflectivity. This "deficient" DBR is supplemented by a conventional reflector—generally a conventional metallic reflector—to result in desired reflectivity greater than about 98% (in most instances in a reflectivity of greater than 99%). The resulting "hybrid" mirror is on the p-conductivity type side since such placement is most effective in reducing the series resistance of the pump path.

A primary aspect of the inventive teaching generally takes the form of what would ordinarily be regarded as a distortion in the DBR portion of the hybrid mirror. In general the DBR layer closest to the conventional reflector is of a thickness either less than or greater than the usual quarter wavelength (or integral number) considered required in a functioning DBR. This layer, thinner than the other Bragg layers if of the index of refraction of the lesser index layer, thicker if of the greater, serves to maximize reflectivity. As discussed more fully in the Detailed Description deviation from λ/4 layer thickness derives from the fact that metallic reflectors are not "ideal" but rather evidence a characteristic penetration depth which results in some destructive interference as between reflected radiation from the front and "back" of the final Bragg layer (the layer closest to the conventional mirror which in effect is altered in thickness due to this characteristic of the metallic reflector. If there is need to interpose a "contact" layer to assure ohmic contact between the conventional and DBR mirrors, the thickness of this "phase matching" layer is further adjusted accordingly.

Other aspects of the laser structure of the invention are known. Such considerations apply to the materials of the DBRs both from the standpoint of optical reflectivity and electrical conductivity. As with other such structures free carriers introduced into the active region are desirably confined by "confinement" layers of sufficiently increased bandgap to prevent escape. Substrate material, like other materials of the structure, substantially defect-free, are as nearly transparent to emitted laser energy as consistent with other requirements.

Structures of the invention may be discrete or may be included in ICs—either OEICs or all-optic. While both electrical and optical paths are through the DBRs—generally through all layers of both DBRs, there are versions of the invention in which paths are not invariably identical. In one version the entirety of the final DBR of the non-hybrid reflector does not contact substrate, but a portion is bared, possibly by etching, e.g. to facilitate coupling to an optical fiber. Another version makes use of a hole in the metallic mirror—for example, for monitoring laser operation.

DETAILED DESCRIPTION

Drawing

Figures 1, 1A, 1B, 1C, 1D:
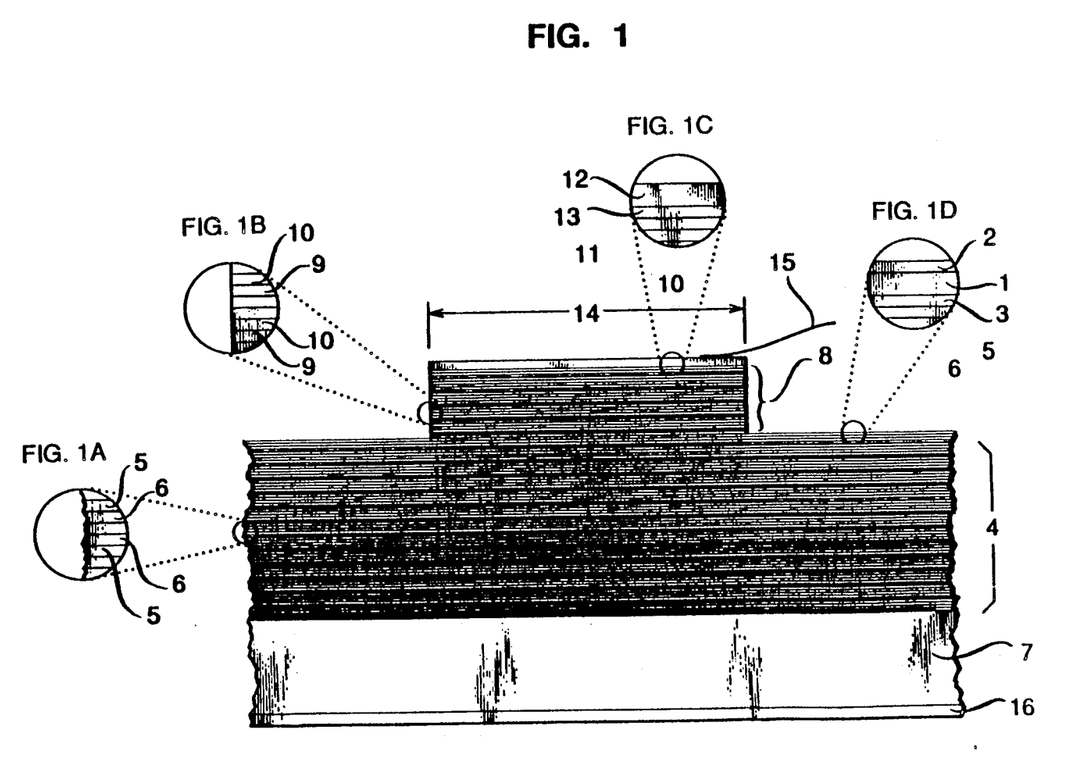
FIG. 1 is a schematic elevational view depicting a laser structure typical of those included in every apparatus of the invention.

The device of FIG. 1 includes an active layer 1 embraced by confinement layers 2 and 3. Lower reflector 4 is a distributed Bragg reflector made up of alternating layers 5 and 6 of high and low refractive index respectively. Since this lower DBR serves as the n-type side of the pn junction layers are doped with n-type significant impurity. In common with usual DBR structures layers 5 and 6 are each of a thickness dimension equal to an integral number of quarter wavelengths—generally one quarter wavelength ($\lambda/4$)—for the wavelength of stimulated emission (as measured in the material of which the DBR is constructed). As discussed in detail further on, the number of 5–6 pairs (the number of periods) is generally sufficient to provide reflectivity of at least 98% and usually greater than 99%—a condition which in at least one example herein is accomplished by use of 23 periods. Substrate 7, is of necessary crystalline perfection and of composition and thickness otherwise suitable to fabrication (e.g. epitaxial growth) and to operation.

Upper DBR 8 made of alternating, generally λ/4 thick layers 9 and 10 of p-type conductivity material of high and low refractive index, n, respectively has a lesser number of periods than that of DBR 4. Uppermost Bragg layer 11 is the "phase-matching" layer designed to maximize constructive interference. For the structure shown the material of conventional mirror 12 does not provide dependable ohmic contact to layer 11. This deficiency is cured by provision of contact layer 13. Layer 11 is of a thickness smaller than or larger than λ/4 depending upon whether it is constructed of the lesser or greater of the material of layers 9 and 10 respectively. Actual thickness of layer 11 is critically dependent on the phase delay introduced by penetration of laser radiation into mirror layer 12 as further varied by layer 13 if present.

Certain structural aspects are not discussed in detail. For example, the particular device shown in FIG. 1 has a hybrid mirror portion which is reduced in area relative to the remainder of the device. It has been found convenient to fabricate arrays by deposition of continuous layers over the entire area to be occupied by lasers. Separation of individual lasers is accomplished by etching to the depth of the upper confinement layer 2 while defining mesa structures of dimension 14. Of course, alternative approaches are known and may be preferred depending on a number of factors: composition of material to be etched, density of laser structures intended, etc. For example, a variant on etch-separation makes use of ion bombardment to render separating material less conducting. Circuit design may dictate separation of the lower Bragg mirrors as well. Of course, device fabrication need not rely on etching but may be the consequence of as-grown structures e.g. by use of selective deposition (perhaps by masking). It is not the purpose to make this part of the description exhaustive. Fabrication approaches suitable for the many aspects of the invention are well known and others are emerging.

Inventive devices exemplified by FIG. 1 owe significance to decreased need for heat dissipation. Actual operation at room temperature is obtainable for duty cycles up to 100% (for CW operation). Nevertheless, there are circumstances where it may be desirable to introduce cooling. Such circumstances, for example, include deliberately pumping above threshold to realize higher power output as well as design criteria which may call for e.g. deliberately decreased mirror reflectivity or deliberately increased active layer thickness. Such structures may profit by use of heat sinks perhaps as aided by thermoelectric cooling means. Such variations are considered well within the skill of the artisan and are not discussed in detail.

Similarly, electrical circuitry is represented in FIG. 1 only schematically by means of electrode 15 (attached to metallic mirror layer 12 and electrode 16 which takes the form of a deposited metallic layer on the underside of substrate 7) in an actual example use was made of a 1,500 Å thick gold-germanium alloy layer.

Figure 2:
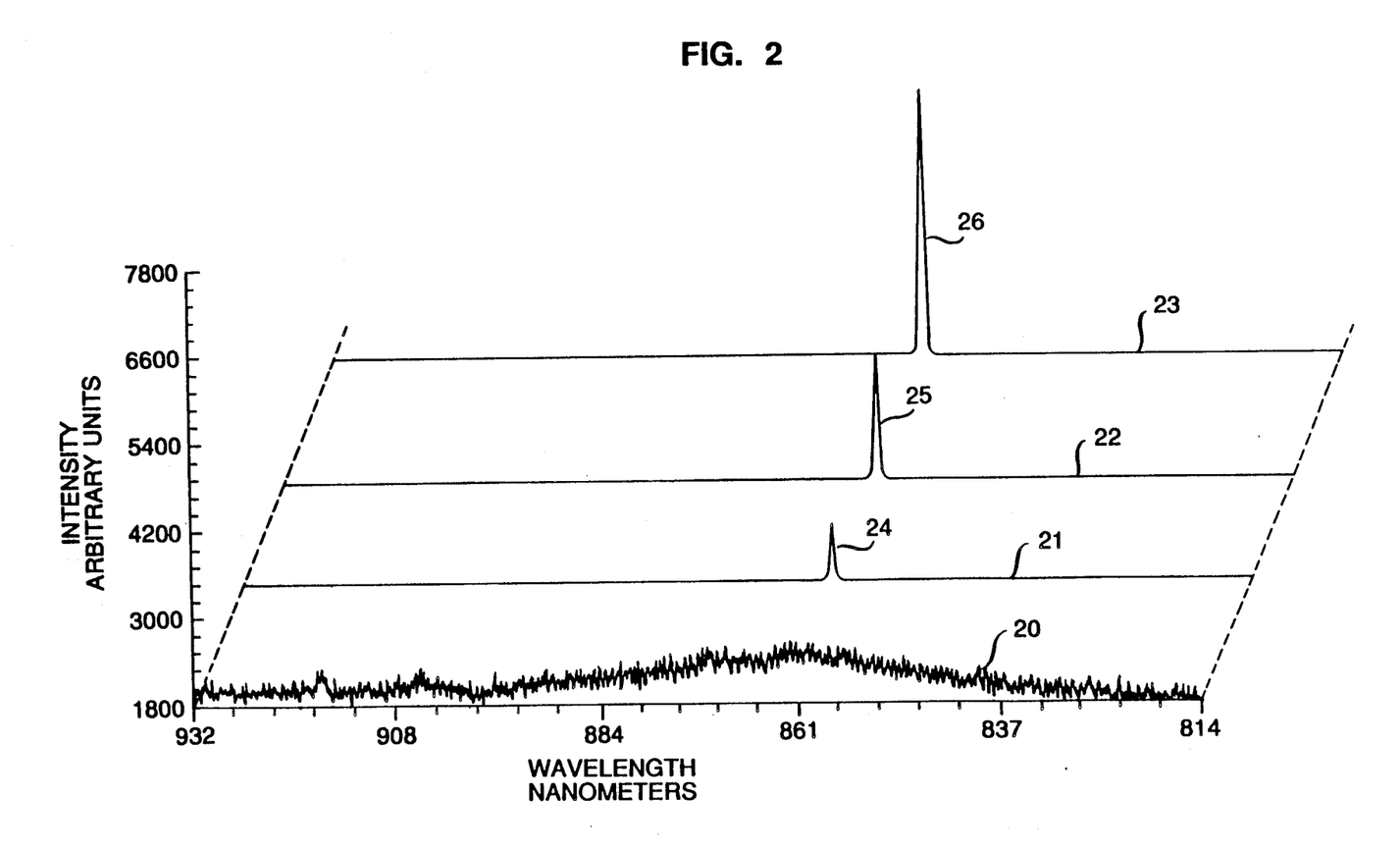
FIG. 2, on coordinates of intensity on the ordinate and wavelength on the abscissa shows intensity dependence on emission wavelength for four different pump levels, one below and three above threshold, for an exemplary device of the invention.

In FIG. 2 Curves 20, 21, 22 and 23 represent emission spectra for pump currents of 20 mA, 25 mA, 30 mA and 40 mA as applied to the device of Example 1. This device uses a 15 μm diameter, 0.5 nm thick active layer of GaAs lasing at 0.8623 μm. Curve 20, below threshold is increased in amplitude tenfold to better show observed details of the spontaneous emission. Curves 21, 22 and 23 all above threshold manifest stimulated emission as spikes 24, 25 and 26. To better show enhancement in intensity—to prevent overlap of the spikes which are all at the same wavelength—the figure is presented as a three-dimensional plot.

Figure 3:
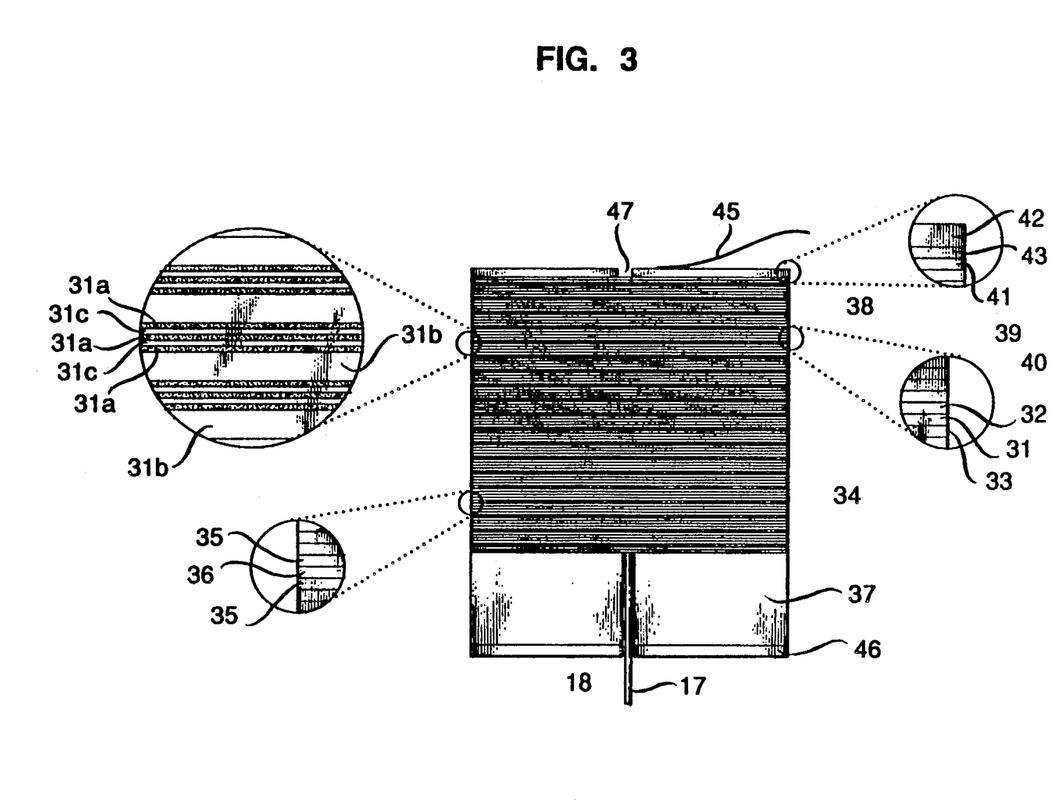
FIG. 3 is a simplified elevational view of a structure such as that depicted in FIG. 1 but providing for possible variations including direct fiber coupling with the emitting surface of the active region of the laser cavity. Discussion of this figure entails use of the fiber as a permanent part of the apparatus as well as its use in testing.

FIG. 3 depicts a variant of the device of FIG. 1. Taking on a contemplated discrete form, the structure shown represents features which may be incorporated separately or in combination in the variety of devices contemplated—whether integrated or discrete. The first feature provides for insertion of optical fiber 17 through substrate hole 18 to bring it into engagement with the lower DBR (to serve a device function or for test purposes—e.g. during fabrication). While as depicted, direct contact is indicated, other considerations, largely in terms of material and structural properties, may dictate an interposed transparent layer not shown.

The device is generally similar to that of FIG. 1 consisting of active region 31 confinement layers 32 and 33 lower Bragg reflector 34, made up of alternating high and low index layers 35 and 36, on substrate 37. The upper mirror is a hybrid structure consisting of Bragg portion 38 composed of high and low index layers 39, 40 and 41. Phase matching is accomplished by appropriate dimensioning of layer 41. Electrical contact as between phase-matching layer 41 and mirror 42 is assured by means of contact layer 43. Wire electrode 45 and ground electrode 46 complete the structure electrically.

Active layer 31 is made up of laser quantum wells 31(a) separated by spacers 31(b) and 31(c). As in known Multi Quantum Well structures, spacers 31(b) are designed to place the QWs at high energy positions within the stimulated laser standing wave. Thinner spacers 31(c) are needed to define the individual QW structures themselves within the trios depicted. Always useful in terms of increased efficiency relative to bulk material, MQW structures as depicted, represent a particularly useful feature in the terms of this invention since heating due to (useless) spontaneous radiation, in turn, due to carrier recombination in low or zero energy positions is avoided. The overall effect is still further lowered lasing threshold current (still further lowered need for heat dissipation). A similar structure may provide for conventional bulk wells, each of thickness equal to a trio of QWs positioned by spacers 31(b).

The schematic representation includes yet another feature, a hole 47 baring a small central region of upper Bragg mirror 38. By maintaining hole 47 small—of the order of one or two wavelengths (of stimulated emission)—the cavity is perturbed very little. The small amount of radiation emitted through hole 47 is coherent but is subject to significant edge diffraction. One purpose that may be served is monitoring simply to assure that the system is operative (that laser radiation is being produced at the substrate side of the cavity).

Figure 4:
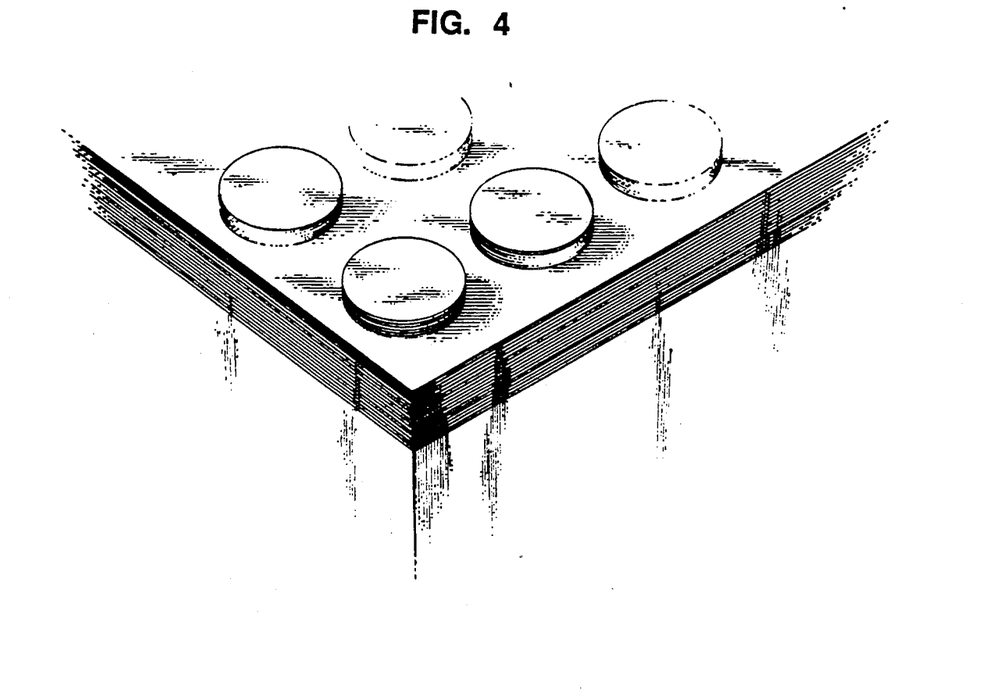
FIG. 4 is a perspective view of a portion of an integrated circuit including an array of lasers in accordance with the invention.
Figure 5:
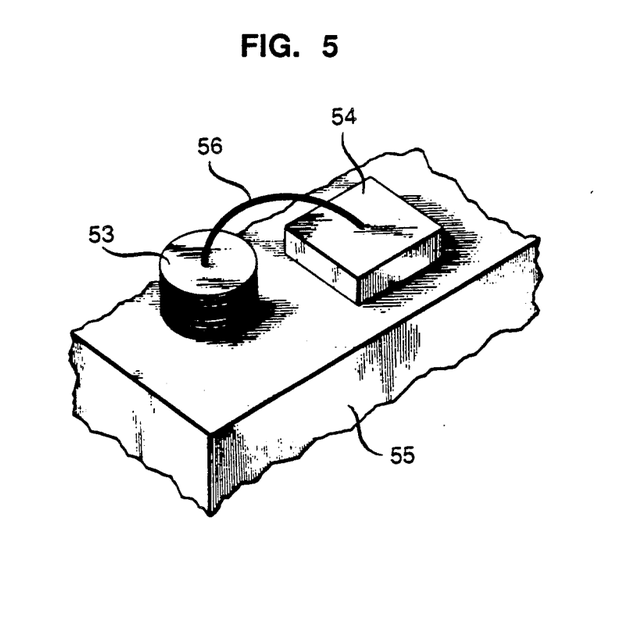
FIG. 5, also in perspective, depicts an integrated circuit containing a laser structure such as included in FIG. 4 together with electronic drive circuitry.

FIG. 4 depicts an array of lasers 51 which may be of the detailed design shown in any of FIGS. 1 and 3. As in those figures, lasers 51 are supported on a substrate, in this instance 52, upon which, and in at least some instances, they were grown, for example, by Molecular Beam Epitaxy. Lasers depicted in this figure as well as in FIG. 5 are exaggerated in dimension in the lasing direction. In general, they are only a few microns in height.

FIG. 5 shows a portion of an OEIC. The portion shown consists simply of laser 53 together with drive electronics 54 both on common substrate 55. The arrangement is schematically shown as connected via lead 56 with the electrical circuit being completed by a common substrate lead.

Design Considerations

1. General

The basic thrust of the invention is that of an expediently fabricated, low threshold (and, therefore, integratable) laser structure, and discussion is largely in such terms. The general teaching does have additional uses e.g. in terms of higher power devices. The advantage in this generic sense concerns the use of the asymmetric Bragg cavity in which a phase-matched conventional metallic mirror supplements the shorter DBR. Design of high power devices may retain the 99+% reflectivity for both cavity ends, as desired for low threshold devices, or design considerations might dictate a lesser reflectivity, likely primarily on the n-conductivity side of the cavity. Also, the active layer may be increased in thickness beyond the minimum permitted by the cavity characteristics.

Lateral dimensions of the laser structure depend upon function. Low current threshold values are meaningfully considered in terms of current per unit area so that the same heat dissipation advantage is in fact realized independent of individual device area assuming reasonably close packing. For IC use, design criteria generally suggest small spot size, in turn, corresponding with an emitting surface of lateral dimensions 10 or 15 μm or smaller.

Following description in this section is, in most respects, in terms of likely greatest interest—in terms of low threshold.

2. Active Region

While the absolute minimum thickness in final detail depends upon the precise nature of the materials used (and in turn upon operational characteristics such as laser wavelength) studies to date suggest use of active regions of a thickness no greater than about 1 μm. Structure optimization for material systems most intensely studied suggest a preferred maximum active region thickness of 0.5 μm. "Thickness" refers to the entire dimension between confinement layers (or between DBRs if confinement layers are not used, whether of uniform bulk material or of spaced wells—either QWs or conventional. For the material system described in Example 1, high duty cycle, up to CW, is permitted for active layer thickness of 0.25 μm. In all systems studied, round-trip gains are easily sufficient to permit lasing with the described Bragg-hybrid Bragg cavities. For optimally designed MQWs and also for spaced conventional wells, such gains are attainable for active layer thickness about the same as for bulk layers, but since a significant part of the active region is made up of spacers, there is less heat generated for given output intensity. A representative MQW structure is described in conjunction with FIG. 3. That structure depends on three trios of quantum wells so positioned by means of spacers as to place them at energy peaks in the standing wave. With spacers, those separating the trios, those at the two mirror boundaries, and those between individual wells of each trio, the total thickness is about 0.3 μm. Examples 2, 3, 5 and 7 depend upon MQW active regions.

From the compositional standpoint, emitting material in the active layer (bulk or well material) is constructed of semiconductor material having a direct bandgap accommodating the desired emission wavelength. While far more general use is expected, near term use is likely in terms of wavelengths of communications interest. Such wavelengths, 0.86 μm, 1.3 μm and 1.55 μm are obtainable by use of well-understood compound semiconductors: GaAs at 0.86 μm and InGaAsP at the other wavelengths. Strained InGaAs may be used at 1.0 μm. The inventive devices are, of course, usable over a much larger wavelength range as permitted by a variety of semiconductor materials.

It is useful to describe aspects of the structure in specific exemplary terms. In terms of the structure of Example 1, as indicated, the active region is gallium arsenide, GaAs. Compositions noted in following subsections are in the same terms—in fact, as used in Example 1.

Another matter, not appropriately discussed in detail, may be mentioned briefly. The effective cavity dimension, determinative of the size of the standing wave and, therefore, of emission wavelength, while based primarily on the thickness of the active region as discussed, is in fact somewhat thicker due to radiation penetration, likely through the entirety of confinement layers if present, and to some penetration depth within the DBRs as well. At this time, determination of precise dimensions corresponding with specified wavelength, is accomplished empirically (by building a first structure, measuring emission λ, adjusting some dimension—perhaps that of the confinement layer—again measuring, etc).

3. Confinement Layers

Nature and function of confinement layers is discussed elsewhere. See H. C. Casey, Jr. and M. B. Panish, "Heterostructure Lasers: Part A Fundamental Principles", (Academic, N.Y. 1978) Sec. 4.6 (Carrier Confinement) pp. 245-253). Its primary purpose is to confine free carriers to the active region. Composition is chosen to yield an energy gap $E_g$ larger than that of the active region (generally a gap differential of 25% is adequate. See H. C. Casey, Jr. and M. B. Panish, "Heterostructure Lasers: Part A Fundamental Principles", (Academic, N.Y. 1978) Sec. 4.6 (Carrier Confinement) pp. 245-253. Thickness of the confinement layer is sufficient to prevent appreciable tunneling (tunneling is of little consequence for thicknesses greater than about 100 Å). Thickness of the confinement layer is not critical—layer thickness of about 1000 Å was used in Example 1. The confinement layer may serve an additional and important function for the heterojunctions generally contemplated—that of minimizing back injection of minority carriers.

It is generally preferred that the laser-functioning pn junction be on the end type side of the cavity. Under these circumstances, the active region is of p-conductivity type. In structures tested, the confinement layer is doped to the same conductivity type as that of the adjacent DBR—in this instance, is of n-type conductivity. Such placement of the functioning junction takes advantage of the fact that electron mobility is inherently greater than that of hole mobility—a design preference of increasing significance for increasing cavity length.

The desire for maximum Δn from the optical standpoint dictates use of the higher index Bragg material at an air interface and choice of the material yielding the greatest Δn at other interfaces (e.g. at the Bragg-active region interface). However, electrical considerations—minimization of electrical resistance—sometimes dictates less Δn values.

The nature and function of the confinement layers has been set forth. While separate confinement layers are usefully employed for the particular material systems of the examples, this is not invariant. Confinement, as well as back injection, are both dependent on bandgap of such layers relative to the adjacent active region. Needed increased gap relative to the active region, as well as appropriate displacement of the relevant band edge values, may be inherent in materials otherwise suitable in construction of the DBR—on either or both sides of the cavity. Elimination of the need for one or both confinement layers may be of considerable benefit in enhancing efficiency.

4. Distributed Bragg Reflectors

Design criteria of DBRs are well known. See M. Born and E. Wolf, "Principles of Optics", (Pergammon, N.Y. 1964) p. 51 (Principles of Multilayer Reflectors). See J. P. Van der Ziel and M. Ilegems, "Applied Optics", vol. 14, no. 11, Nov. 1975 (MBE Growth). They consist of alternating layers of material of differing refractive index—are generally discussed in terms of "periods" each consisting of a pair of high and low index material. For the constructive reinforcement of radiation reflected from successive junctions, layer thicknesses are an integral number of quarter wavelengths (for the desired coherent radiation as measured in the layer material). To minimize DBR thickness, layers are of $\lambda/4$ thickness. Minimization is useful electrically to minimize series resistance, and from the optical standpoint, it results in minimized scattering (scattering centers correspond with positions of n or p-type dopant atoms) as well as in minimized insertion loss from statistically distributed defect sites, etc. Minimum DBR thickness, still corresponding with $\lambda/4$ thick layers also minimizes diffraction losses (greater path length aggravates any edge diffraction effects otherwise present).

Index values are chosen to yield the maximum attainable value of $\Delta n$ commensurate with other device criteria. Such criteria include the electrical property, series resistance, and the various optical properties. Optimal device design may be quite sophisticated. As an example, one tested device made advantageous use of deliberately reduced $\Delta n$ in the p-type DBR thereby requiring an increase in the number of periods to achieve the desired 99+% reflectivity. The primary objective was to reduce barrier height at the Bragg junctions to lessen heating. In this instance, the overall $I^2R$ heating was reduced even though the path length was increased.

Design of the hybrid mirror is complex. Here, permitted loss is most importantly in terms of significant p-type resistance (resistance of p-type material is two to three orders of magnitude greater than that of n-type material in the DBR structure). Generally, the objective is a composite reflectivity sufficient for lasing under the desired conditions. In terms of the usual inventive thrust, that is, in terms of low lasing threshold, reflectivity again of $\approx 99\%$ or greater is desired. Structures as used in Examples 1 through 7 depend upon hybrid mirrors of 6-period DBRs as supplemented by the metallic mirror for yielding this reflectivity.

Reflectivity of the hybrid mirror is critically dependent upon the thickness of the DBR layer adjacent the metallic reflector. It has been indicated that use of unadjusted layer thickness results in destructive interference to the extent that reflectivity is significantly reduced. Under the usually preferred design approach in which the affected DBR layer is of the lesser index valuee, phase matching requires thinning, generally of a value of approximately 25% relative to that of the next DBR layer of lesser index. For structures in which the DBR layer to be adjusted is of the greater DBR index, phase matching requires that it be thickened, generally to an extent of approximately 50% relative to the nearest DBR layer of greater index. The explanation is in the difference in phase shift as between the back side reflected wave and the front side reflected wave as dependent upon whether the junction is with a preceding DBR layer of high or low index.

There is yet another advantage due to the hybrid mirror structure. The effect of the metallic reflector is to flatten spectral response relative to that of the DBR portion. Where cavity optimization or other consideration leads to use of different compositions in the two DBRs, spectral flattening increases spectral overlap and alleviates one more design complication.

Selection of appropriate metallic material for construction of the hybrid mirror is based on a number of factors which need not be discussed in detail. Basically, spectral properties of metals sufficient for selection for use at different emission wavelengths are well known. Other properties of consequence have to do with stability e.g. against migration, e.g. of alloying elements as caused during heat-processing (which while useful electrically, may impair reflectivity due to accompanying interfacial roughening), effectiveness of electrical contact (in the instance of FIG. 1 giving rise to use of a contact layer intermediate the metal and the DBR), etc. Both unalloyed silver and gold were used satisfactorily in structures described in the examples.

Again, the n-type DBR is generally designed to yield close to perfect reflectivity for low threshold devices. For the material system of Example 1, twenty pairs were used yielding the desired 99+%.

DBR design has been in terms of constancy of both high and low index layer compositions. A variety of circumstances, intentional or accidental, may dictate otherwise.

5. The Substrate

In general, the substrate does not serve a necessary device function. This is especially true in terms of optical functioning. Reason for being, in most instances, is to serve as an appropriate body upon which fabrication of the functional device depends—generally in terms of epitaxy with all of the characteristics and requirements that this imposes. In other terms, the substrate, since likely present, may serve as a support and may also serve in some secondary electrical sense—e.g. for biasing via an electrode on its underside. In functioning terms, therefore, the substrate is merely a part of the structure to be tolerated. From the optical standpoint, use of appropriately broad bandgap material assures transparency for wavelengths corresponding with included energy levels. From the electrical standpoint, the desire is for the best possible conductivity for the usual instance in which biasing of the supported structure includes the substrate as part of the series path.

By far the most significant characteristic of the substrate, for fabrication approaches usually contemplated, is in terms of crystal parameters and perfection required to assure sufficient absence of defects in epitaxial grown layers.

Choice of substrate is on bases generally understood to those knowledgeable in crystal growth. Substrate materials used in the examples in the following section are reasonably illustrative.

6. The Examples

Introduction

Examples set forth in tabular form are generally representative of operation at wavelengths of communications interest. The purpose is to teach composition and design criteria for fabrication. Specific criteria, both structural and operational, depend upon specific objectives. For example, devices may be operated, in pulse mode by use of pulse generators, using well known designs. Duty cycle may be varied. Duty cycle is defined as the fraction of time that pulse biasing is non-zero (consistent with usual convention, pulses for this purpose are treated as though square). Devices may be operated at very small duty cycles up to and including 100% (or continuous wave"). As stated above, an advantage of the invention in terms of near-term use contemplates the feasibility of high duty cycles due to feasibility of operation at low threshold current. In these terms, a preferred aspect of the invention is for devices permissive of duty cycles of at least about 50% (easily attainable for reported structures having threshold current densities, $J_{th}$, of 10 kA/cm$^2$). In this respect, too, tabular examples are only representative. That is, many of the observations reported in the text are based on room temperature operation. While avoidance of cooling is certainly economically desirable, there are many instances where e.g. heat sinking in combination with thermoelectric cooling may permit operation at power levels, duty cycles, or even wavelength ranges not immediately attainable for specific material systems/device designs without cooling.

Concentration on wavelengths within the general range of 0.84 μm–1.55 μm is, from the standpoint of present development, most easily accomplished in either of the III-V material systems GaAs or InP. The first, usable over the shorter end of the wavelength range is easily altered in accordance with the present state of the art to result in electrical doping and compositional modification to produce high and/or low refractive indices for useful Bragg operation. Examples 1 and 2 depend upon partial substitution, specifically 10 At % of Al for Ga for the higher index of the pair and upon complete substitution (of Al for Ga for the lower index). Confinement layers used in the relevant examples are based on 30 At % substitution of Al for Ga to increase bandgap. Specific compositions used are based on extensive widely acknowledged experience. For example, partial substitution by aluminum in the high index Bragg layer in examples 1 and 2 is designed to lessen absorption relative to unmodified GaAs for emission of the wavelength range indicated.

The examples are to a certain extent based on practical considerations. For example, as noted above, unmodified GaAs is significantly absorbing for laser emission within the wavelength range 0.84 μm–0.87 μm, and accordingly, an absorption problem is introduced by use of this material in the substrate (for usually contemplated operation in which the beam is emitted through the substrate). It is clear that a substrate of $Al_{0.1}Ga_{0.9}As$ would alleviate this problem. As a practical matter, wafers of this material of suitable crystalline perfection are not readily available. Etching to permit direct access to emission is the alternative suggested.

Dimensions and certain structural details set forth in the table are exemplary only. In general, these considerations have been discussed. For example, for consistency, active layers are generally set forth either as bulk material layers of thickness 0.25 μm or as MQWs consisting of 9 wells and appropriate spacers as discussed in conjunction with FIG. 3. MQW structures of examples 2, 5 and 7 depend upon direct energy gaps characteristic of the reported materials in their equilibrium state. Inclusion of example 3 is to illustrate attainment of needed gaps by deliberate introduction of crystallographic strain. In this instance, strain due to crystalline mismatch is introduced into the $In_{0.15}Ga_{0.85}As$ which, based on experimental observation, is reduced to a thickness of 80 Å (relative to the usual 100 Å thickness both of the GaAs wells in this example and of unstrained wells of the other examples). The purpose of thinning, while mildly disadvantageous from a functioning standpoint, is to minimize crystalline damage of the growing layer due to mismatch. Generally, specific MQW structures described are only representative—device functioning objectives may dictate greater or lesser numbers of wells. As discussed, in conjunction with FIG. 3, useful well structures, still retaining some advantage over uniform bulk layers, may make use of conventional wells of bulk material (of wells appreciably larger than ≈100 Å required for true quantum well operation).

For the purposes of this description, it is considered adequate to discuss QWs as having a thickness of ≈100 Å. In fact, this thickness is quite appropriate for semiconductor materials generally contemplated. It is beyond the necessary scope of this description to discuss this critical dimension in terms of electron wave functions (in terms of deBroglie wavelengths).

Actual device design entails a number of additional considerations. Study has indicated that a metal mirror alone may under best conditions yield a reflectivity of about 95%. Using gold, as an example, proper phase matching may result in total reflectivities for the hybrid mirror of 98.2%, 99.1% and 99.5%, respectively for three pair, five pair and seven pair hybrid portions. By comparison, a pure DBR in the same general system requires twenty pairs for 99.5% reflectivity at an air interface.

| Emission wavelength | active layer | confinement layers | DBR mirror layers $n_H/n_L$ | Substrate | |
|---|---|---|---|---|---|
| 0.84–0.87 μm | GaAs 0.25 μm | $Al_{0.3}Ga_{0.7}As$ 0.15 μm | $Al_{0.1}Ga_{0.9}As$/AlAs (600Å, 700Å) 20 pairs | GaAs 500 μm | absorbing, needs etching for emission |
| 0.84–0.87 μm | GaAs/$Al_{0.1}Ga_{0.9}As$ QWs (100Å, 100Å) 9 wells | $Al_{0.3}Ga_{0.7}As$ 0.15 μm | $Al_{0.1}Ga_{0.9}As$/AlAs (600Å, 700Å) 20 pairs | GaAs 500 μm | absorbing, needs etching for emission |
| 0.93–0.98 μm | $In_{0.15}Ga_{0.85}As$/GaAs QWs (80Å, 100Å) 9 wells | $Al_{0.3}Ga_{0.7}As$ 0.15 μm | GaAs/AlAs (660Å, 770Å) 20 pairs | GaAs 500 μm | Transparent |
| 1.3 μm | $In_{0.73}Ga_{0.27}As_{0.6}P_{0.4}$ 0.25 μm | $In_{0.84}Ga_{0.16}As_{0.33}P_{0.67}$ 0.15 μm | $In_{0.84}Ga_{0.16}As_{0.33}P_{0.67}$/$AlAs_{0.5}Sb_{0.5}$ (920Å, 1100Å) 20 pairs | InP 500 μm | Transparent |
| 1.3 μm | $In_{0.73}Ga_{0.27}As_{0.6}P_{0.4}$/$In_{0.84}Ga_{0.16}As_{0.33}P_{0.67}$ QWs (100Å, 100Å) 9 wells | InP 0.15 μm | $In_{0.84}Ga_{0.16}As_{0.33}P_{0.67}$/$AlAl_{0.5}Sb_{0.5}$ (920Å, 1100Å) 20 pairs | InP 500 μm | Transparent |
| 1.55 μm | $In_{0.6}Ga_{0.4}As_{0.85}P_{0.15}$ 0.25 μm | $In_{0.73}Ga_{0.27}As_{0.6}P_{0.4}$ 0.15 μm | $In_{0.73}Ga_{0.27}As_{0.6}P_{0.4}$/$AlAs_{0.5}Sb_{0.5}$ (1100Å, 1300Å) 20 pairs | InP 500 μm | Transparent |

-continued

| Emission wavelength | Examples | | | | |
|---|---|---|---|---|---|
| | active layer | confinement layers | DBR mirror layers $n_H/n_L$ | Substrate | |
| 1.55 μm | $In_{0.53}Ga_{0.47}As/In_{0.73}Ga_{0.27}As_{0.6}P_{0.4}$ QWs(100Å, 100Å) 9 wells | $In_{0.84}Ga_{0.16}As_{0.33}P_{0.67}$ 0.15 μm | $In_{0.73}Ga_{0.27}As_{0.6}P_{0.4}/AlAs_{0.5}Sb_{0.5}$ (1100Å, 1300Å) 20 pairs | InP 500 μm | Transparent |

*All mirrors were studied and verified
All active materials are used at the specified wavelengths in conventional edge emitting laser devices.

We claim:

1. Apparatus comprising at least one electrically pumped vertical cavity laser consisting essentially of an active region within a cavity dependent for cavitation upon two Distributed Bragg Reflectors, each including successive pairs of high and low refractive index material, one of such DBRs being of n-type conductivity and the other being of p-type conductivity, together with means for electrically pumping, said means including passage of electrical current through at least a substantial number of such pairs in both DBRs
characterized in that the p-type DBR has a lesser number of such pairs but is supplemented by a metallic reflector and in that the DBR layer closest to the metallic reflector, referred to as the phase matching DBR layer, is adjusted in thickness relative to that of the next DBR layer of corresponding refractive index to accommodate effective thickness variation due to emission penetration into adjoining material, adjustment increasing reflectivity by lessening destructive interference, to result in a "hybrid" reflector, in which laser cavity reflectivity is due to reflectivity of at least 98% at each cavity end.

2. Apparatus of claim 1 in which the thickness of the active region is a maximum of 1 μm in the lasing direction.

3. Apparatus of claim 2 in which reflectivity of the hybrid mirror is greater than 99%.

4. Apparatus of claims 1, 2 or 3 in which the active region consists essentially of bulk material.

5. Apparatus of claims 1, 2 or 3 in which the active region consists essentially of at least one well of active material positioned by means of spacer material so as to substantially coincide in position with an energy peak of a cavitated standing wave during operation of said laser.

6. Apparatus of claim 5 in which the said well is a quantum well.

7. Apparatus of claim 5 in which the said well is of sufficient thickness in the lasing direction that it evidences essentially bulk characteristics.

8. Apparatus of claim 1 in which the said active region includes at least two wells and at least three spacers to position wells at at least two energy peaks of a cavitated standing wave during operation of the said laser.

9. Apparatus of claim 1 in which the said laser includes a confinement layer adjacent at least one surface of the said active region for the purpose of increasing confinement of free electrical carriers within the said active region, the said confinement layer having an energy bandgap which is greater than that of the DBR layer adjacent the confinement layer.

10. Apparatus of claim 9 in which the said confinement layer is the same conductivity type as that of the adjacent DBR and in which the confinement layer presents a substantial energy barrier to lessen back injection of minority electrical carriers.

11. Apparatus of claim 10 in which the said confinement layer is on the n-type side of the cavity and in which the energy barrier is the consequence of a confinement layer band edge which is substantially different from that of the adjacent portion of the active region.

12. Apparatus of claim 1 including a substrate supporting the said cavity.

13. Apparatus of claim 12 in which at least the initial portion of the supported structure is epitaxially grown on the said substrate.

14. Apparatus of claim 13 in which epitaxial growth is by MBE.

15. Apparatus of claim 14 in which the said substrate evidences substantial absorption for laser emission and in which a hole is provided in the substrate for accessing laser emission.

16. Apparatus of claim 15 including an optical fiber passing through such hole.

17. Apparatus of claim 12 in which the DBR closest to the substrate is of n-type conductivity.

18. Apparatus of claim 17 in which the electrical pump path includes an electrode on the underside of the substrate.

19. Apparatus of claim 18 in which the said electrical pump path includes the metallic reflector.

20. Apparatus of claim 19 in which there is a contact layer intermediate the said metallic reflector and the underlying DBR, the said contact layer assuring ohmic contact.

21. Apparatus of claim 12 comprising an integrated circuit which includes a multiplicity of said electrically pumped lasers.

22. Apparatus of claim 21 in which the said integrated circuit additionally includes electronic elements.

23. Apparatus of claim 22 in which electrical pumping involves functioning of an included electronic element.

24. Apparatus of claim 1 in which the phase matching DBR layer is of said low refractive index and in which its thickness in the emission direction is less relative to that of the next low index DBR layer.

25. Apparatus of claim 24 in which the thickness of the phase matching DBR layer is about 25% less than that of the next low index DBR layer.

26. Apparatus of claim 1 in which the phase matching DBR layer is of high refractive index and in which its thickness in the emission direction is increased relative to that of the next high index DBR layer.

27. Apparatus of claim 26 in which the thickness of the phase matching DBR layer is about 50% larger than that of the next high index DBR layer.

28. Apparatus of claim 1 in which the said DBRs are of different chemical composition resulting in differing spectral reflectivity and in which spectral reflectivity is flattened by inclusion of the said metallic reflector, thereby increasing cavity efficiency relative to that of a structure excluding the said metallic reflector.

* * * * *